US011908531B2

(12) United States Patent
Papandreou et al.

(10) Patent No.: US 11,908,531 B2
(45) Date of Patent: Feb. 20, 2024

(54) DETECTING AND MANAGING UNDER-PROGRAM FAILURES IN NON-VOLATILE MEMORY

(71) Applicant: INTERNATIONAL BUSINESS MACHINES CORPORATION, Armonk, NY (US)

(72) Inventors: Nikolaos Papandreou, Thalwil (CH); Roman Alexander Pletka, Uster (CH); Radu Ioan Stoica, Zurich (CH); Nikolas Ioannou, Zurich (CH); Charalampos Pozidis, Thalwil (CH); Timothy J. Fisher, Cypress, TX (US); Aaron Daniel Fry, Richmond, TX (US)

(73) Assignee: International Business Machines Corporation, Armonk, NY (US)

( * ) Notice: Subject to any disclaimer, the term of this patent is extended or adjusted under 35 U.S.C. 154(b) by 268 days.

(21) Appl. No.: 17/495,574

(22) Filed: Oct. 6, 2021

(65) Prior Publication Data

US 2023/0108194 A1 Apr. 6, 2023

(51) Int. Cl.
*G11C 16/34* (2006.01)
*G11C 16/32* (2006.01)
(Continued)

(52) U.S. Cl.
CPC ........ *G11C 16/3459* (2013.01); *G11C 16/102* (2013.01); *G11C 16/26* (2013.01);
(Continued)

(58) Field of Classification Search
CPC ... G11C 16/3459; G11C 16/102; G11C 16/26; G11C 16/32; G11C 16/3404;
(Continued)

(56) References Cited

U.S. PATENT DOCUMENTS 8,386,890 B2 2/2013 Wezelenburg et al.
9,319,073 B2 4/2016 Alhussien et al.
(Continued)

FOREIGN PATENT DOCUMENTS

CN 104461401 A 3/2015

OTHER PUBLICATIONS

Program error mitigation in MLC NAND flash memory with soft decision decoders, Published Date: Apr. 27, 2021.

*Primary Examiner* — Joshua L Schwartz
(74) *Attorney, Agent, or Firm* — Brian F. Russell; Anthony Curro

(57) ABSTRACT

A non-volatile memory includes a plurality of cells each individually capable of storing multiple bits of data including bits of multiple physical pages. A controller of the non-volatile memory issues a command to perform a programming pass for a physical page among the multiple physical pages. The controller determines whether or not the programming pass took less than a minimum threshold time and no program fail status indication was received. Based on determining the programming pass took less than a minimum threshold time and no program fail status indication was received, the controller detects an under-programming error and performs mitigation for the detected under-programming error.

12 Claims, 8 Drawing Sheets

(51) Int. Cl.
  *G11C 16/10* (2006.01)
  *G11C 16/26* (2006.01)

(52) U.S. Cl.
  CPC .......... *G11C 16/32* (2013.01); *G11C 16/3404* (2013.01); *G11C 16/3495* (2013.01)

(58) Field of Classification Search
  CPC . G11C 16/3495; G11C 29/52; G11C 16/0483; G11C 2029/0409; G11C 2029/0411; G11C 2211/5644; G11C 11/5628; G11C 11/5671; G11C 16/349
  See application file for complete search history.

(56) References Cited

U.S. PATENT DOCUMENTS

| | | | |
|---|---|---|---|
| 10,366,770 B1* | 7/2019 | Kurosawa | G11C 16/3454 |
| 10,741,262 B2 | 8/2020 | Lin et al. | |
| 2007/0247911 A1 | 10/2007 | Shim | |
| 2019/0180831 A1* | 6/2019 | Shukla | G11C 16/26 |
| 2020/0234780 A1 | 7/2020 | Papandreou et al. | |
| 2021/0264980 A1* | 8/2021 | Sagron | G06F 11/1068 |

* cited by examiner

DETECTING AND MANAGING UNDER-PROGRAM FAILURES IN NON-VOLATILE MEMORY

BACKGROUND OF THE INVENTION

This disclosure relates to data processing and data storage, and more specifically, to detecting and managing under-program failures in a non-volatile memory system.

NAND flash memory is an electrically programmable and erasable non-volatile memory technology that stores one or more bits of data per memory cell as a charge on the floating gate of a transistor or a similar charge trap structure. The amount of charge on the floating gate modulates the threshold voltage of the transistor. By applying a proper read voltage and measuring the amount of current, the programmed threshold voltage of the memory cell can be determined and thus the stored information can be detected. Memories storing one, two, three and four bits per cell are respectively referred to in the art as Single Level Cell (SLC), Multi-Level Cell (MLC), Three Level Cell (TLC), and Quad Level Cell (QLC) memories. In a typical implementation, a NAND flash memory array is organized in blocks of physical memory, each of which includes multiple physical pages each in turn containing a multiplicity of memory cells. By virtue of the arrangement of the word and bit lines utilized to access memory cells, flash memory arrays have generally been programmed on a page basis, but erased on a block basis.

In multi-bit (i.e., MLC, TLC and QLC) NAND flash memory, information is stored by programming the memory cells to various quantized threshold voltage levels according to the device's programming algorithm, which maps the binary bit values to discrete threshold voltage levels. In response to a page read command, the binary bit values are retrieved by applying appropriate read voltages that divide the programmed threshold voltage window into discrete regimes and by then applying a reverse mapping between the detected threshold voltage levels and the corresponding binary bit values. Over the lifetime of a multi-level NAND flash memory device, the distributions of programmed threshold voltage generally become degraded due to the effects of wear on the memory cells. If the required distributions of programmed threshold voltage cannot be programmed for a page within a maximum time and/or programming pulse budget, programming of the page fails, and a controller may take corrective action, for example, by retiring a group of pages containing the page or the block containing the page.

BRIEF SUMMARY

In state-of-the-art multi-bit per-cell NAND flash memory, a flash array is physically formed in multiple stacked layers, each containing a plurality of word-lines. Each word-line in turn provides access to multiple pages. In these flash memories, error events are observed as the result of cell wear due to accumulated program/erase cycles, data retention due to charge-loss over time, read disturb due to accumulated page reads, or other transient effects that may cause the threshold voltage distributions to shift or widen or change from their nominal values after page programming. The present disclosure is related to the problem of error events which may be caused due to under-programmed threshold voltages following page programming. That is, the distributions of threshold voltages following page programming have one or more threshold voltages that remain lower than their respective target voltages. Often, these error events may affect several adjacent pages, e.g., some or most of the pages within a given layer.

The present disclosure recognizes that conventional error detection techniques do not effectively address errors arising from under-programming. Errors arising from under-programming are conventionally detected by a controller performing reads to the affected pages subsequent to programming, for example, as part of a host read or as background read performed by health checking process. In either case, these error detection reads consume power and scarce memory bandwidth and reduce memory throughput. In cases in which under-programming errors are detected by a host read or a background read, discovery of the under-programming errors can also be delayed for a significant period of time after programming.

Errors arising from under-programming also cannot be effectively mitigated by conventional techniques. For example, read voltage shifting, to be effective in correcting errors, requires the distributions of programmed threshold voltages to be properly defined, i.e., tightly programmed according to their target values, but shifted either higher or lower than the target values. Because under-programmed threshold voltage distributions are typically not properly defined, such read voltage shifting is not effective in substantially reducing errors arising from under-programming. Another conventional approach to error mitigation is to simply retire the affected pages, layers, or blocks. However, error mitigation by retirement leads to an undesirable loss of storage capacity, and in the case of errors arising from under-programming, can result in the retirement of pages, layers, or blocks that, if not retired, may return to a healthy state and have a significantly longer useful life.

In view of the shortcomings with conventional techniques of error detection and mitigation as they may be applied to errors arising from under-programming, the present disclosure provides improved techniques of detecting and mitigating errors arising from under-programming that utilize program time as a metric to detect under-programming.

In at least one embodiment, a non-volatile memory includes a plurality of cells each individually capable of storing multiple bits of data including bits of multiple physical pages. A controller of the non-volatile memory issues a command to perform a programming pass for a physical page among the multiple physical pages. The controller determines whether or not the programming pass took less than a minimum threshold time and no program fail status indication was received. Typically, a program fail status indicates that the required distributions of programmed threshold voltage cannot be programmed for a page within a maximum time and/or programming pulse budget. Based on determining the programming pass took less than a minimum threshold time and program fail status indication was received, the controller detects an under-programming error and performs mitigation for the detected under-programming error.

DETAILED DESCRIPTION

Figure 1A:
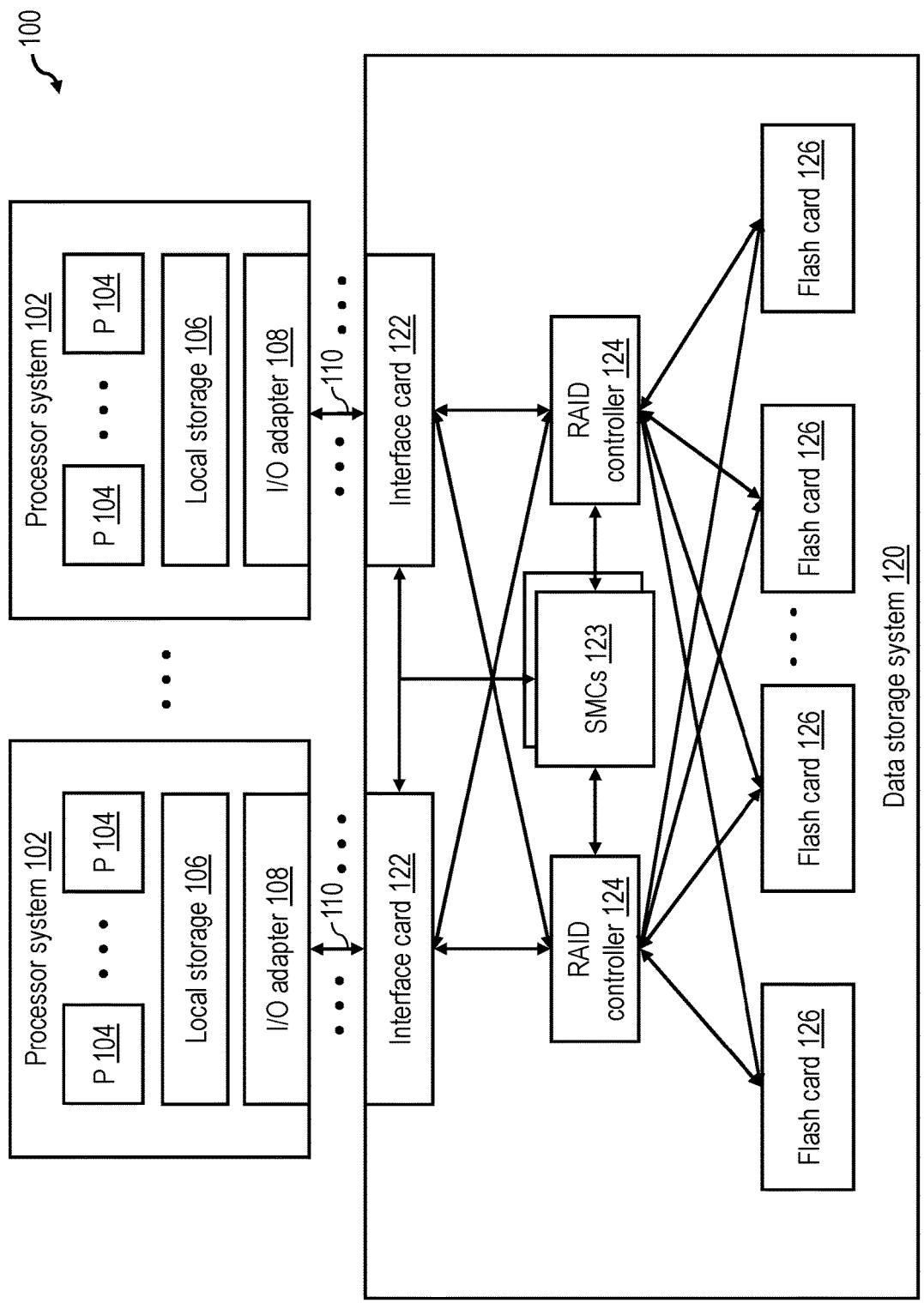
FIG. 1A is a high level block diagram of a data processing environment in accordance with one embodiment.

With reference to the figures and with particular reference to FIG. 1A, there is illustrated a high level block diagram of an exemplary data processing environment 100 including a data storage system 120 having a non-volatile memory array as described further herein. As shown, data processing environment 100 includes one or more hosts, such as a processor system 102 having one or more processors 104 that process instructions and data. A processor system 102 may additionally include local storage 106 (e.g., dynamic random access memory (DRAM) or disks) that may store program code, operands and/or execution results of the processing performed by processor(s) 104. In various embodiments, a processor system 102 can be, for example, a mobile computing device (such as a smartphone or tablet), a laptop or desktop personal computer system, a server computer system (such as one of the POWER series of servers available from International Business Machines Corporation), or a mainframe computer system. A processor system 102 can also be an embedded processor system using various processors such as ARM, POWER, Intel x86, NVidia, or any other processor combined with memory caches, memory controllers, local storage, I/O bus hubs, etc.

Each processor system 102 further includes an input/output (I/O) adapter 108 that is coupled directly (i.e., without any intervening device) or indirectly (i.e., through at least one intermediate device) to a data storage system 120 via an I/O channel 110. In some embodiments, data storage system 120 may be integral to a processor system 102. In various embodiments, I/O channel 110 may employ any one or a combination of known or future developed communication protocols, including, for example, Fibre Channel (FC), FC over Ethernet (FCoE), Internet Small Computer System Interface (iSCSI), InfiniBand, Transport Control Protocol/Internet Protocol (TCP/IP), Peripheral Component Interconnect Express (PCIe), etc. I/O requests communicated via I/O channel 110 include read requests by which a processor system 102 requests data from data storage system 120 and write requests by which a processor system 102 requests storage of data in data storage system 120.

Although not required, in the illustrated embodiment, data storage system 120 includes multiple interface cards 122 through which data storage system 120 receives and responds to I/O requests of hosts via I/O channels 110. Each interface card 122 is coupled to each of multiple Redundant Array of Inexpensive Disks (RAID) controllers 124 in order to facilitate fault tolerance and load balancing. Each of RAID controllers 124 is in turn coupled (e.g., by a PCIe bus) to non-volatile storage media, which in the illustrated example include multiple flash cards 126 bearing NAND flash memory. In other embodiments, alternative and/or additional non-volatile storage devices can be employed.

In the depicted embodiment, the operation of data storage system 120 is managed by redundant system management controllers (SMCs) 123, which are coupled to interface cards 122 and RAID controllers 124. In various embodiments, system management controller 123 can be implemented utilizing hardware or hardware executing firmware and/or software.

Figure 1B:
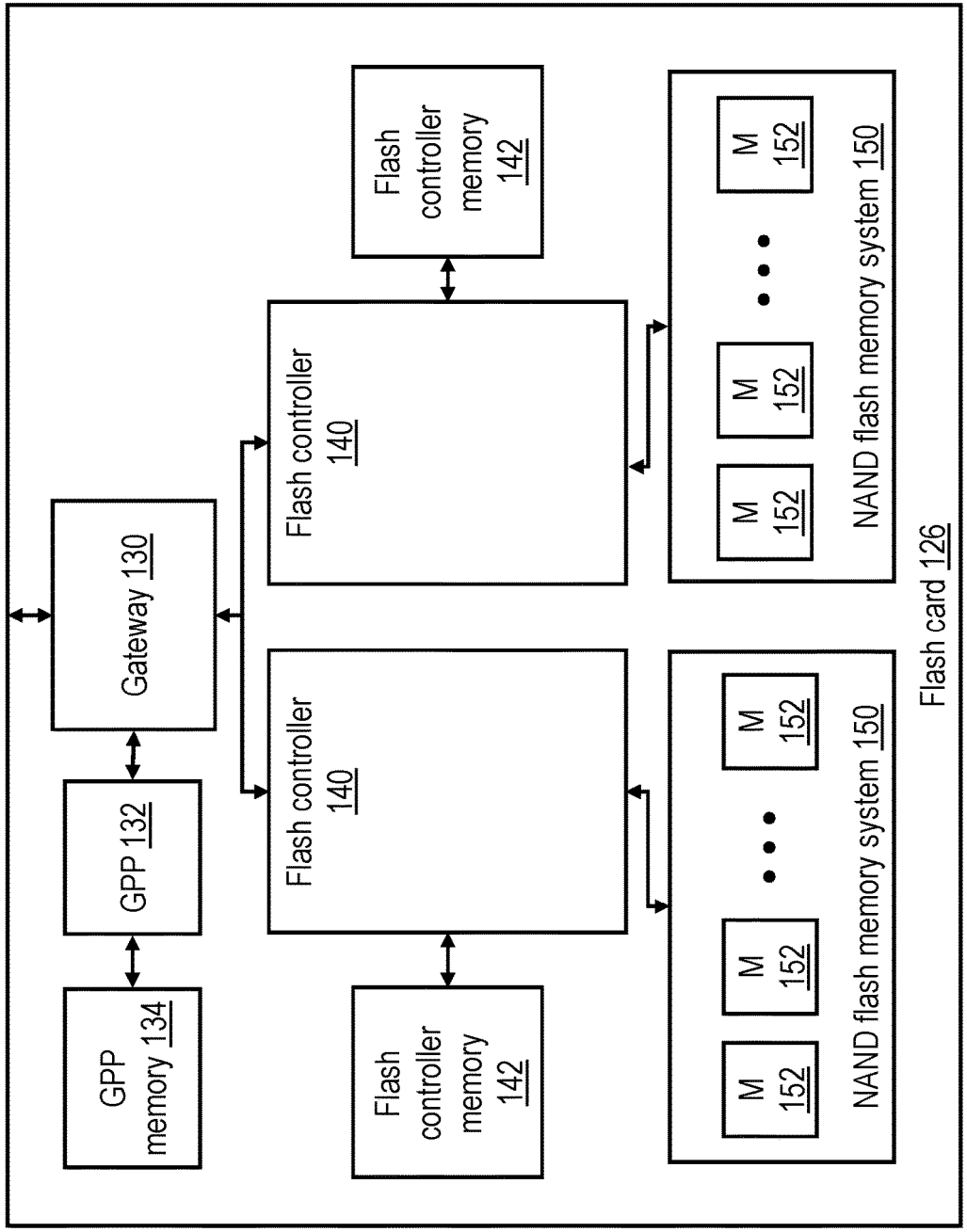
FIG. 1B is a more detailed block diagram of a flash card of the data storage system of FIG. 1A.

FIG. 1B depicts a more detailed block diagram of an exemplary embodiment of a flash card 126 of data storage system 120 of FIG. 1A. Flash card 126 includes a gateway 130 that serves as an interface between flash card 126 and RAID controllers 124. Gateway 130 is coupled to a general-purpose processor (GPP) 132, which can be configured (e.g., by program code) to perform pre-processing on requests received by gateway 130 and/or to schedule servicing of the requests by flash card 126. GPP 132 is coupled to a GPP memory 134 (e.g., Dynamic Random Access Memory (DRAM)) that can conveniently buffer data created, referenced and/or modified by GPP 132 in the course of its processing or data flowing through the gateway 130 destined for one or more of the flash controllers 140.

Gateway 130 is further coupled to multiple flash controllers 140, each of which controls a respective NAND flash memory system 150. Flash controllers 140 can be implemented, for example, by an Application Specific Integrated Circuit (ASIC) and/or a Field Programmable Gate Array (FPGA) and/or a microprocessor, and each has an associated flash controller memory 142 (e.g., DRAM). In embodiments in which flash controllers 140 are implemented with an FPGA, GPP 132 may program and configure flash controllers 140 during start-up of data storage system 120. After startup, in general operation flash controllers 140 receive read and write requests from gateway 130 that request to read data stored in the associated NAND flash memory system 150 and/or to store data in the associated NAND flash memory system 150. Flash controllers 140 service these requests, for example, by accessing NAND flash memory system 150 to read or write the requested data from or into NAND flash memory system 150 or by accessing a memory cache (not illustrated) associated with NAND flash memory system 150.

Flash controllers 140 implement a flash translation layer (FTL) that provides logical-to-physical address translation to enable access to specific memory locations within NAND flash memory systems 150. In general, a request received by flash controller 140 from a host device, such as a processor system 102, contains the logical block address (LBA) at which the data is to be accessed (read or written) and, if a write request, the write data to be stored to data storage system 120. The request may also specify the amount (or size) of the data to be accessed. Other information may also be communicated depending on the protocol and features supported by data storage system 120. The flash translation layer translates LBAs received from a RAID controller 124 into physical addresses assigned to corresponding physical location in NAND flash memory systems 150. Flash controllers 140 may perform address translation and/or store mappings between logical and physical addresses in a logical-to-physical translation data structure, such as a logical-to-physical translation table (LPT), which may conveniently be stored in flash controller memory 142.

NAND flash memory systems 150 may take many forms in various embodiments. In the embodiment shown in FIG. 1B, each NAND flash memory system 150 includes multiple (e.g., 32) individually addressable NAND flash memory storage devices 152. In the illustrated example, the flash memory storage devices 152 take the form of a board-mounted flash memory modules, for example, Multi-Level Cell (MLC), Three Level Cell (TLC), or Quad Level Cell (QLC) NAND flash memory modules. The effective storage capacity provided by flash memory storage devices 152 can be increased through the implementation of data compression, for example, by flash controllers 140 and/or high level controllers, such as GPPs 132, RAID controllers 124 or SMCs 123.

Figure 2:
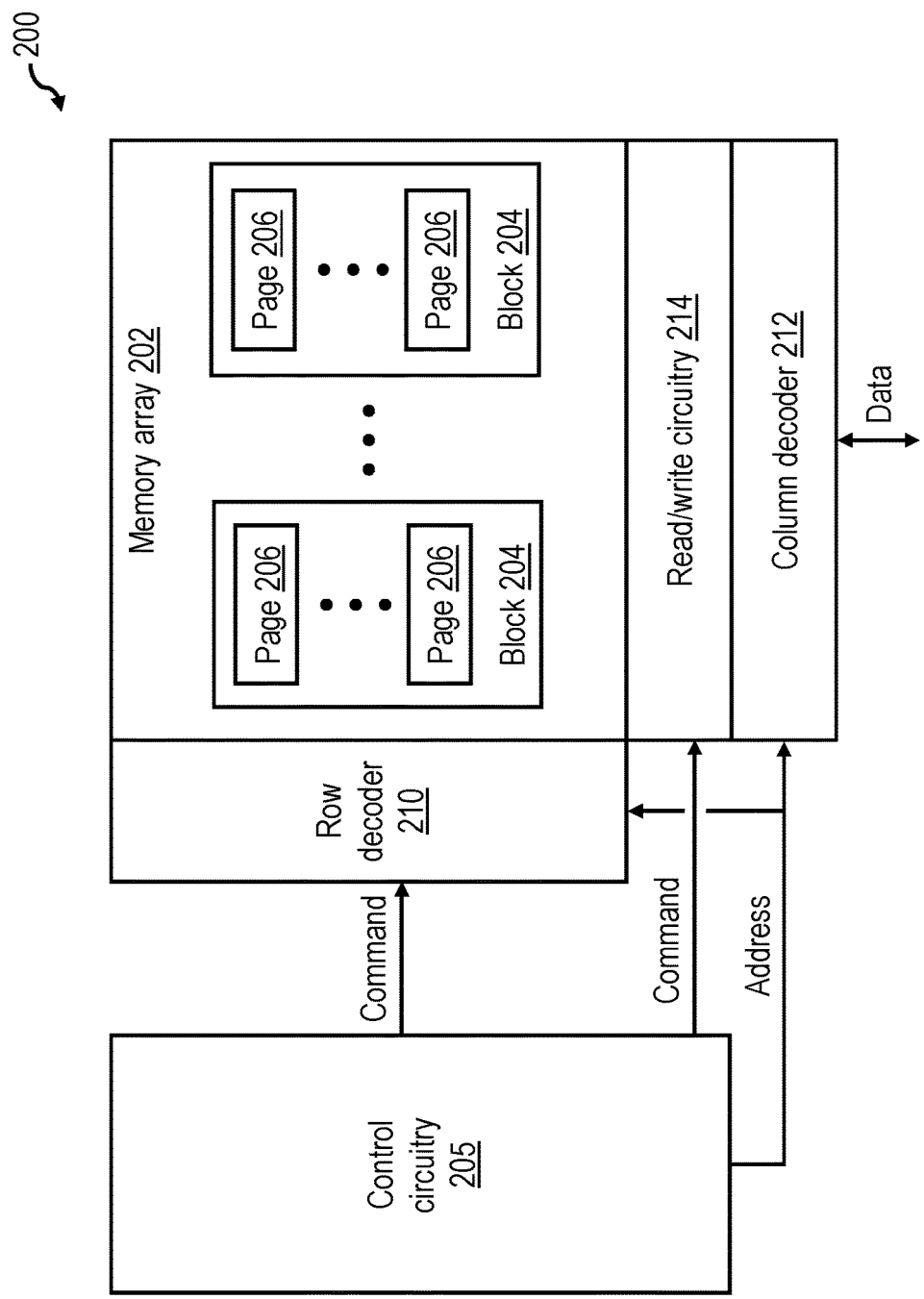
FIG. 2 depicts an exemplary NAND flash memory module in accordance with one embodiment.

Referring now to FIG. 2, there is depicted a block diagram of an exemplary flash memory module 200 that can be utilized to implement any of the NAND flash memory storage devices 152 of FIG. 1B. Flash memory module 200 includes one or more memory die, each implementing at least one memory array 202, preferably formed of a three-dimensional array of NAND flash memory cells, as described further below with reference to FIG. 3. As indicated in FIG. 2, the memory cells within memory array 202 are physically arranged in multiple blocks 204, each in turn including multiple physical pages 206. Physical pages 206 can be grouped in page groups, which can each be formed, for example, of all the physical pages 206 coupled to a common wordline, of all physical pages 206 in one or more layers in a 3D NAND flash, or, more generally, of physical pages 206 having similar characteristics.

As is known to those skilled in the art, NAND flash memory, such as that employed in memory array 202, must be erased prior to being programmed. Further, NAND flash memory can be (but is not required to be) constrained by its construction such that the smallest granule of storage that can be erased is a block 204 and the smallest granule of storage that can be accessed by a read or write request is fixed at the size of a single physical page 206. It should be appreciated in this regard that the LBAs provided by host devices correspond to logical pages within a logical address space, where each logical page typically has a size of 4 kilobytes (kB). Physical pages 206, in contrast, typically have a larger size, for example, 16 kB, and can thus host multiple logical pages.

Flash memory module 200 further includes a row decoder 210 through which word lines of memory array 202 can be addressed and a column decoder 212 through which bit lines of memory array 202 can be addressed. In addition, flash memory module 200 includes read/write circuitry 214 that enables the memory cells of a physical page 206 to be programmed or read in parallel. Flash controller 200 additionally includes control circuitry 205 that provides chip-level control of operation of memory array 202, including read and write accesses made to physical pages 206 in memory array 202, erasure of blocks 204, and the amplitude, duration and polarity of related voltages applied to memory array 202.

Figure 3:
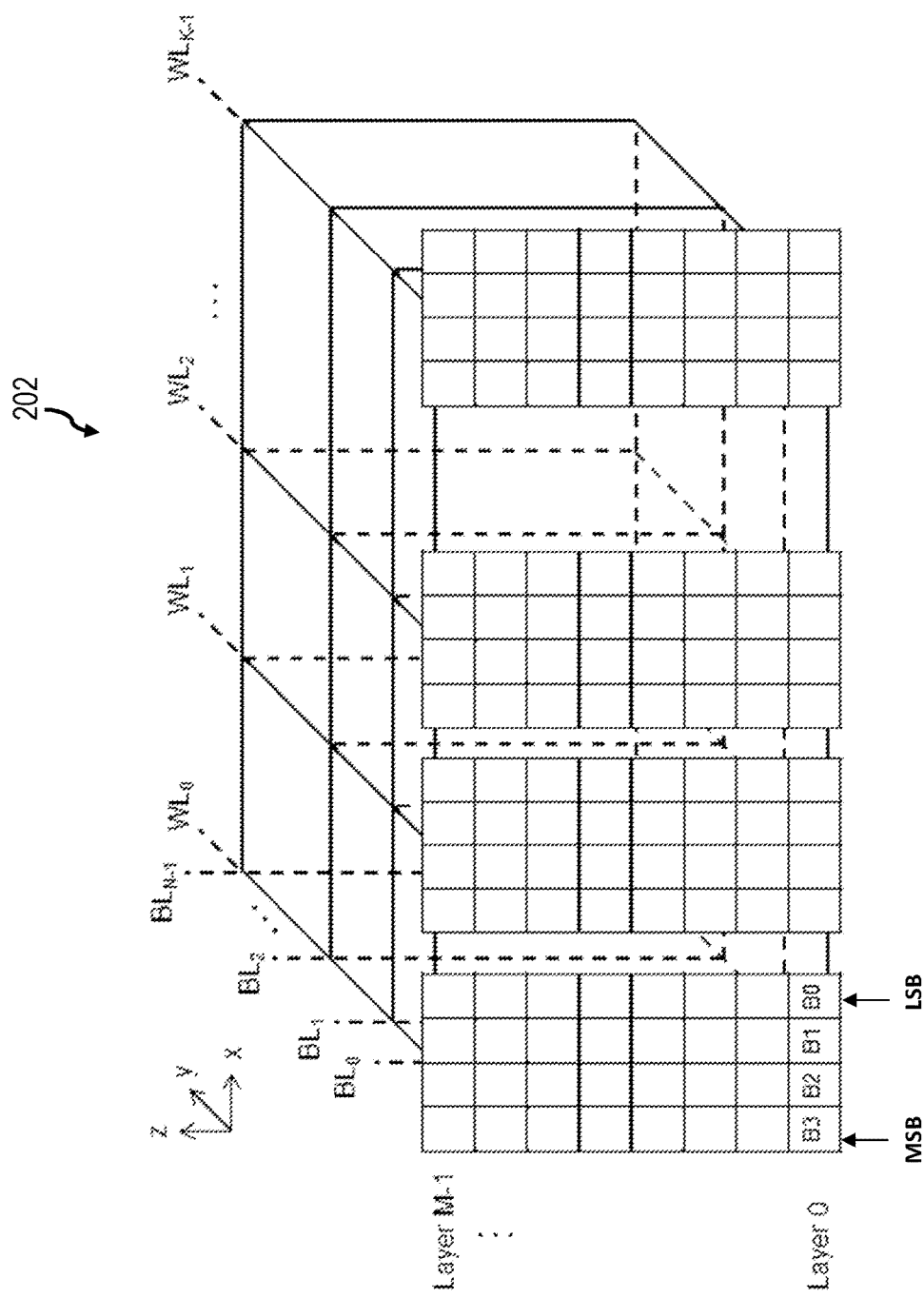
FIG. 3 is a more detailed block diagram of a portion of the memory array in FIG. 2 in accordance with one embodiment.

With reference now to FIG. 3, there is illustrated a more detailed block diagram of a portion of the memory array 202 of FIG. 2 (e.g., a block 204) in accordance with one embodiment. In the illustrated example, memory array 202 is a 3D NAND flash memory formed of multiple stacked physical layers. In the illustrated coordinate system having mutually orthogonal X, Y, and Z axes, memory array includes M layers (Layer 0 to Layer M−1) distributed along the Z axis. For example, in current state-of-the-art memory devices, memory array 202 may include 96 or 128 layers. Each of the M layers includes N bit-lines ($BL_0$-$BL_{N-1}$) along the Y axis and K word-lines ($WL_0$-$WL_{K-1}$) along the X axis. A memory cell is present at each intersection of a word-line and bit-line. Each memory cell can store multiple bits of data, with the differing bit values represented by differing gate voltages. For example, in the case of a QLC NAND memory array 202, each memory cell stores four bits of data labeled B0, B1, B2, and B3 from the least significant bit (LSB) to the most significant bit (MSB). For each word-line, the data bit in each bit position (B0 . . . B3) belongs to a respective different one of a plurality of physical pages 206. Depending on the terminology used by different vendors, the pages containing the bits B0, B1, B2, B3 of the memory cells sharing a common word-line may be denoted as lower-page (LP), upper-page (UP), extra-page (XP), top-page (TP), respectively, or as lower-page (LP), middle-page (MP), upper-page (UP), top-page (TP), respectively. For example, using the terminology employed by some vendors, all B0 bits in the memory cells connected to a common word-line $WL_k$ of layer $L_m$ form a lower page (LP), all B1 bits in the memory cells connected to a common word-line $WL_k$ of layer $L_m$ form an upper page (UP), all B2 bits in the memory cells connected to a common word-line $WL_k$ of layer $L_m$ form an extra page (XP), and all B3 bits in the memory cells connected to a common word-line $WL_k$ of layer $L_m$ form a top page (TP). Although these pages may be referred to utilizing other terminology, this terminology is employed hereafter for ease of reference.

Figure 4:
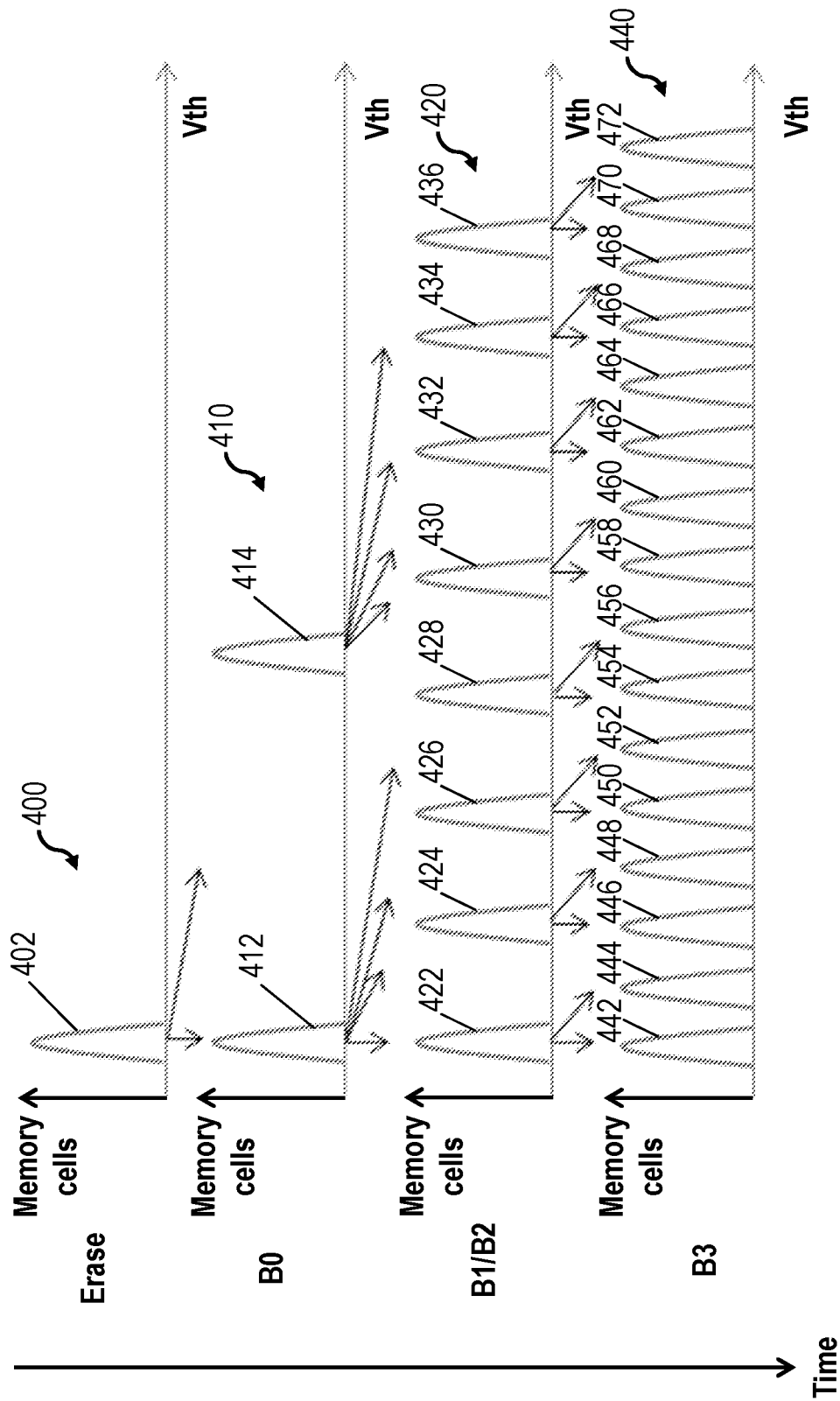
FIG. 4 is a timing diagram illustrating the programming of read threshold voltages in three passes for an exemplary quad-level cell (QLC) NAND flash memory in accordance with one embodiment.

In at least some embodiments, the pages in each WL may be written in multiple steps or passes. For example, FIG. 4 is a first timing diagram illustrating the programming of read threshold voltages in three passes for pages of an exemplary quad-level cell (QLC) NAND flash memory in accordance with one embodiment. In this example, flash controller 140 first directs control circuitry 205 to erase all of the pages in an erase pass 400, which returns all memory cells storing bits in the pages coupled to the word-line to a low voltage state, as represented by voltage distribution 402. Following erasure, flash controller 140 directs control circuitry 205 to program the LP formed of bits B0 in a first pass 410. In first pass 410, control circuitry 205 stores either a value of b'0' or b'1' in each memory cell in accordance with the bit values of bit B0, thus establishing each memory cell in either voltage distribution 412 or 414. Flash controller 140 subsequently directs control circuitry 205 to program the UP and XP (formed of bits B1 and B2 in all memory cells connected to the word-line) in a second pass 420. To do this, control circuitry 205 reads the existing bit value from each memory cell, combines that bit value with the bit values of the two additional bits (i.e., B1 and B2) and encodes the resulting 3-bit value in one of eight voltage distributions 424-436. As suggested by arrows, memory cells previously in voltage distribution 412 are updated to one of voltage distributions 422-428, and memory cells previously in voltage distribution 414 are updated to one of voltage distributions 430-436. Thereafter, flash controller 140 directs control circuitry 205 to program the TP formed of bits B3 in a third pass 440. To program the TP, control circuitry 205 reads the existing bit values encoded in each memory cell, combines those bit values with the value of the MSB (i.e., B3) and encodes the resulting 4-bit value in one of sixteen voltage distributions 442-472. As suggested by arrows, memory cells previously in voltage distribution 412 are updated to one of voltage distributions 442-456, and memory cells previously in voltage distribution 414 are updated to one of voltage distributions 458-472.

The purpose of programming the pages in multiple passes as shown in FIG. 4 is to produce the sixteen threshold voltages utilized to encode 4 bits of data in an incremental fashion. Thus, in this example, the first pass produces two threshold voltage distributions, the second pass produces eight threshold voltage distributions, and the third pass produces a full sixteen threshold voltage distributions. The higher the pass order, i.e. the more levels are produced, the tighter the threshold voltage distributions become, which generally means the program time increases for higher order pages.

Depending on the memory block organization in terms of number of pages per layer and the device-specific page program order, each of passes 400, 410, 420, and 440 for a given word-line may be interleaved with accesses to other pages in the same or different layers of memory array 202. For example, assuming pages LP, UP, XP, and TP that share the same physical cells, then in accordance with the multi-pass page program process given in FIG. 4, the LP is programmed in the first pass, the XP and UP are programmed in the second pass after performing Pa passes to other pages, and TP is thereafter programmed in a third pass after performing Pb passes to other pages.

Figure 5:
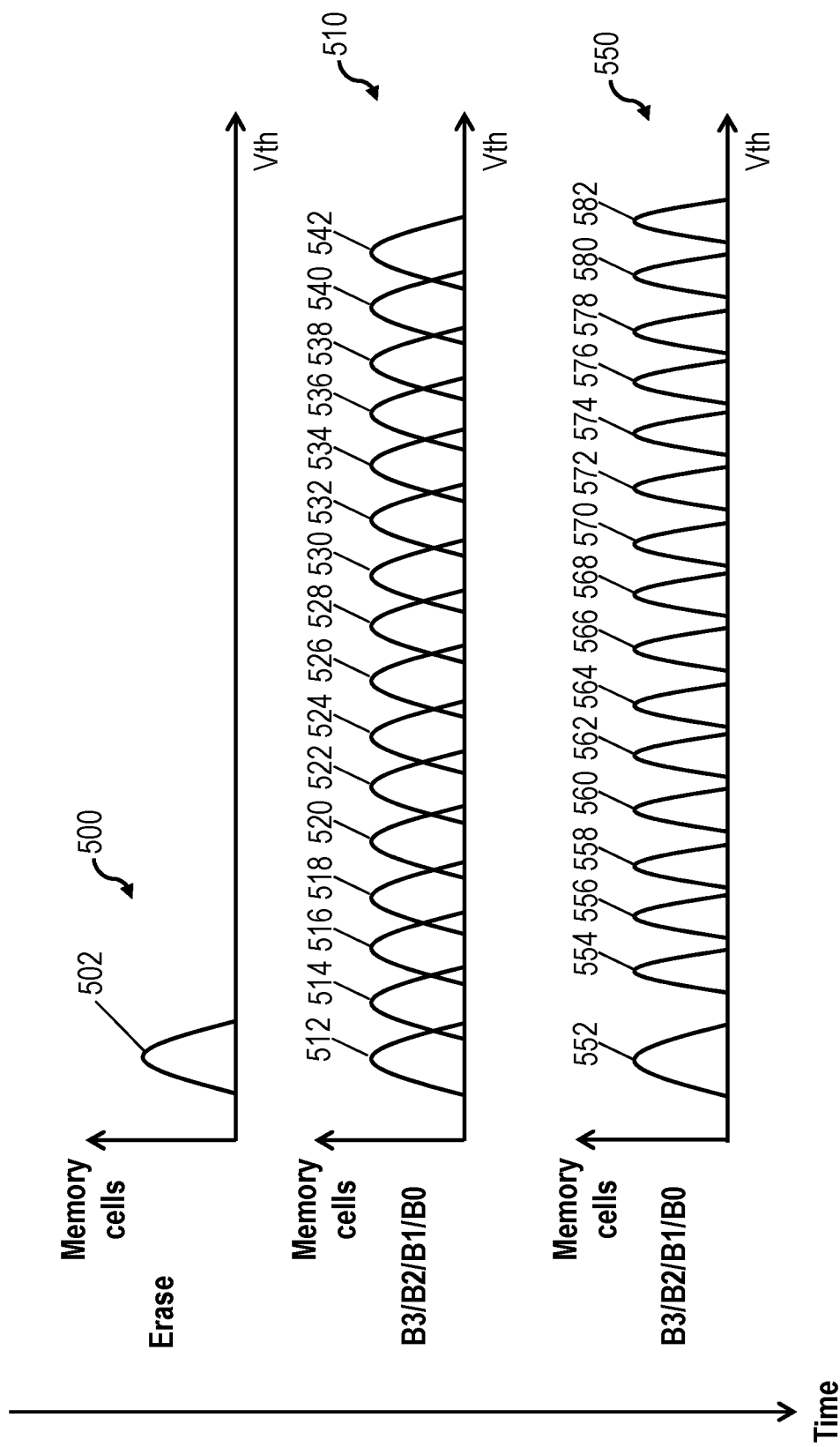
FIG. 5 is a timing diagram illustrating the programming of read threshold voltages in two passes for an exemplary quad-level cell (QLC) NAND flash memory in accordance with one embodiment.

With reference now to FIG. 5, there is illustrated a second timing diagram depicting the programming of read threshold voltages for pages of an exemplary quad-level cell (QLC) NAND flash memory in two passes in accordance with one embodiment. In this example, flash controller 140 first directs control circuitry 205 to erase all of the pages in an erase pass 500, which returns all memory cells storing bits in the pages coupled to the word-line to a low voltage state, as represented by voltage distribution 502. Following erasure, flash controller 140 directs control circuitry 205 to program all four pages corresponding to bits B3-B0 in a first pass 510 to produce a coarse set of 16 threshold voltages 512-542. In a subsequent second pass 550, flash controller 140 again provides the data for all four pages to control circuitry 205 and directs control circuitry 205 to program all four pages to form the final 16 threshold voltages 552-582.

Figure 6:
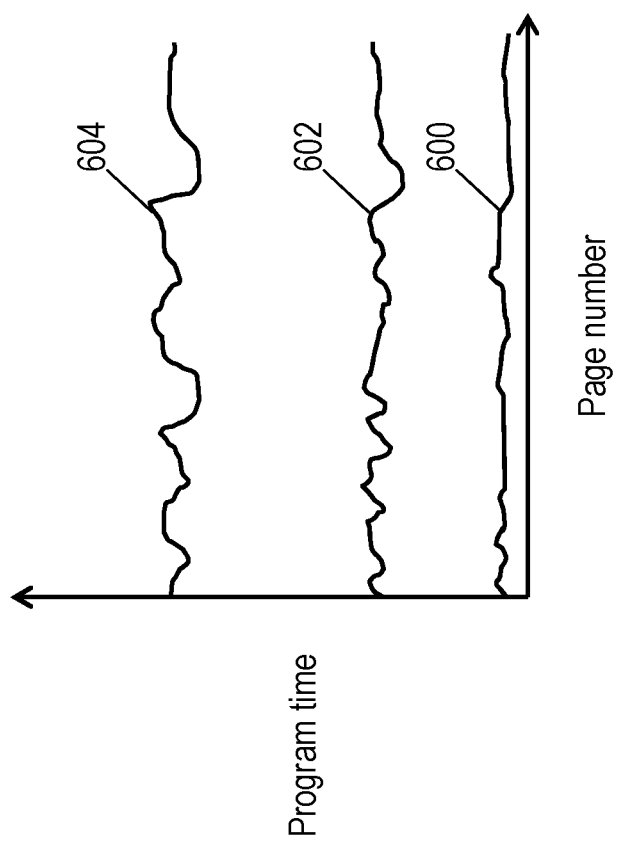
FIG. 6 is a graph of an exemplary distribution of program time versus page number for an exemplary QLC NAND flash memory.

The program time of physical pages varies based on a variety of factors, including, for example, wear (e.g., as indicated by a per-block the program/erase (P/E) cycle count), layer, page address (or page number), type of page (e.g., LP, XP, UP, or TP), and/or programming pass. FIG. 6 is a graph that graphically illustrates an exemplary distribution of program time versus page number for an exemplary QLC 3D NAND flash memory programmed in three passes as shown in FIG. 4. In FIG. 6, LPs programmed in the first programming pass, which are generally indicated at reference numeral 600, exhibit a fairly tight program time distribution. The middle pages (XPs and UPs) exhibit a greater distribution of program times in the second pass, as shown at reference numeral 602. The TPs, which are programmed in the third pass, exhibit an even greater distribution of program times, as shown at reference numeral 604. It should be noted that, as wear increases, the average program time for a given set of page criteria (e.g., P/E cycles, layer, page address, page type, etc.) can increase, or in some cases, decrease. In general, control circuitry 205 of memory modules 200 typically caps the maximum program time and, if unable to achieve a desired distribution within the maximum program time, returns a "program status fail" indication to the flash controller 140.

Figure 7:
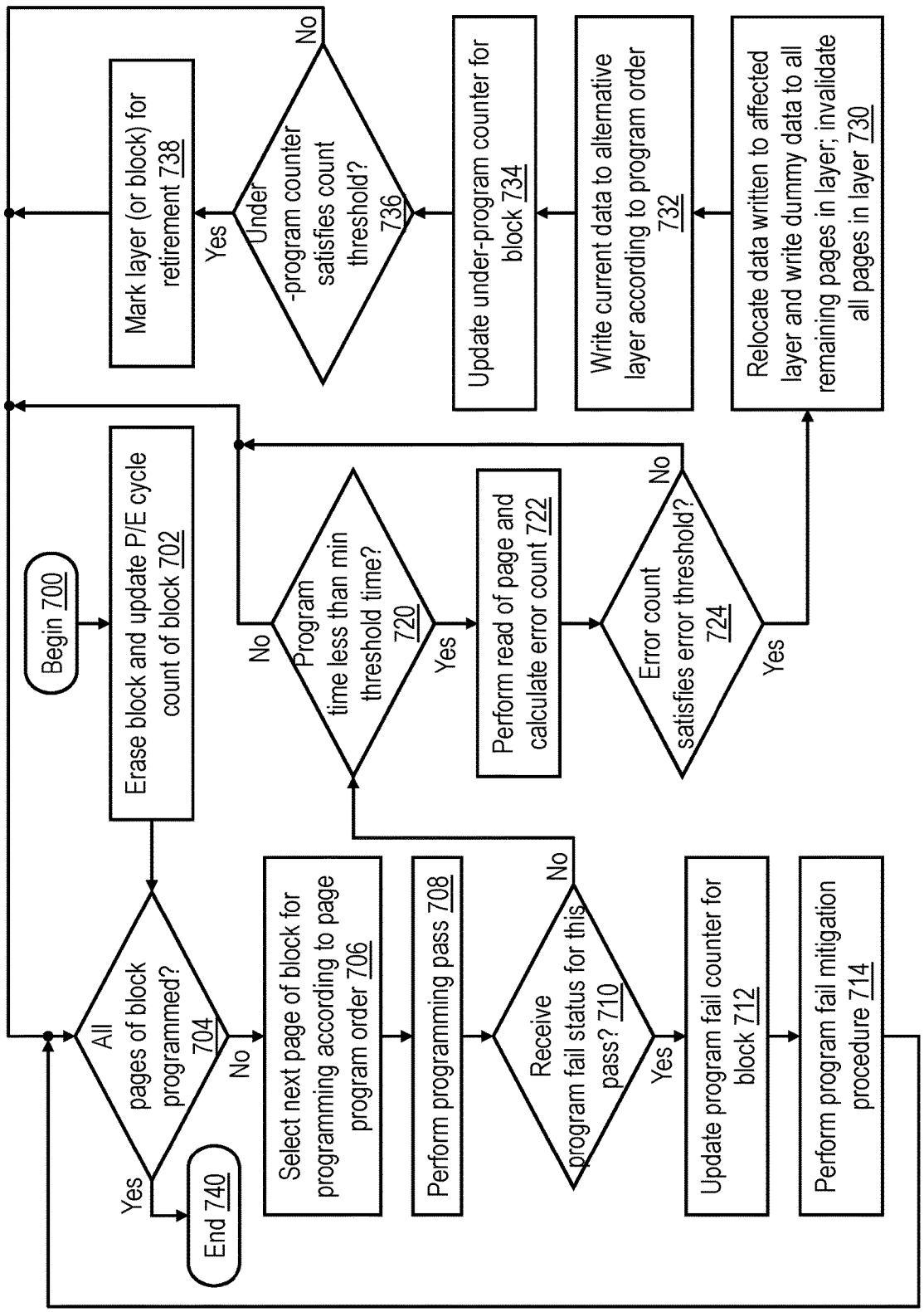
FIG. 7 is a high-level logical flowchart of an exemplary process for detecting and mitigating under-programming errors in a non-volatile memory in accordance with one embodiment.

Accordingly, with reference now to FIG. 7, there is illustrated a high-level logical flowchart of an exemplary process for detecting and mitigating under-programming errors in a non-volatile memory in accordance with one embodiment. The process of FIG. 7 can be performed by a "controller," for example, by a flash controller 140 and/or GPP 132, either entirely in hardware or with a combination of hardware and software and/or firmware.

The process of FIG. 7 begins at block 700, for example, in response to the controller determining that a block 204 of memory array 202 is ready to be erased. The process then proceeds from block 700 to block 702, which illustrates the controller erasing one of blocks 204 in memory array 202 in preparation for programming and updating a corresponding P/E cycle count for the block 204. When data are ready to be written to the block, the process enters a programming loop in which the controller determines at block 704 whether all physical pages 206 of the block 204 have been programmed. If so, the process of FIG. 7 ends at block 740. If, however, the controller determines at block 704 that all pages of the block have not yet been programmed, the process passes to block 706, which illustrates the controller selecting a next physical page 206 of the block 204 to program in accordance with a predetermined program order, such as the order depicted in FIG. 5.

At block 708, the controller issues a command to the memory module 200 to cause the control circuitry 205 to perform a programming pass for the selected physical page 206. At block 710, the controller determines whether or not a "program fail status" indication was received for the programming pass depicted at block 708. If so, the controller updates (e.g., increments) an program fail counter that records a number of program fail status indications received for the block, for example, in a given P/E cycle or in a given time interval (block 712). The controller then performs a program fail mitigation procedure, which, in some cases, can be conventional (block 714). Thereafter, the process of FIG. 7 returns to block 704. In some cases, in the event a program fail status indication is received, the controller may decide to retire the block and write the data to a new block. In this case, the process of FIG. 7 may return to block 700 following block 712.

Referring again to block 710, if the controller makes a determination that a "program fail status" indication was not received for the most recent programming pass, the controller additionally determines at block 720 whether or not the program time of the most recent programming pass was less than a minimum threshold time. In accordance with the disclosed embodiments, a program time that is less than the minimum threshold time is utilized to detect under-programming of the target physical page 206. In some embodiments, the controller can make the determination depicted at block 720 based on receipt from the memory module 200 of an under-program status message specifically indicating that the programming interval was shorter than the minimum threshold time. Alternatively or additionally, the controller can make the determination depicted at block 720 based on monitoring specific electrical signals of the electrical interface between the controller and the memory module that indicate the busy time of the memory module when performing, e.g., a page program operation. In the above cases, the minimum threshold time applicable to a particular page 206 can be determined, for example, by characterization based on one or more page criteria, such as wear (e.g., as indicated by the block's P/E cycle count), the layer containing the page 206, the average program time for pages in the same layer, the page address, the page type (e.g., LP, XP, UP, or TP), and/or programming pass. As will be appreciated, the minimum threshold time will vary for different physical pages 206 and may vary over time for a given page 206.

In response to a determination at block 720 that the program time was not less than the minimum threshold time, the process of FIG. 7 returns to block 704 and following blocks, which have been described. If, however, the controller detects under-programming of the page 206 based on an affirmative determination at block 720, the controller performs a read of the recently written page and calculates an error count for the page (block 722). At block 724, the controller determines whether or not the error count for the page satisfies (e.g., is greater than or equal to) an error threshold. If not, the page programming pass was satisfactory despite the program time being less than the minimum threshold time, and the process returns to block 704. If, however, the controller determines at block 724 that the error count for the page satisfies the error threshold, the process proceeds from block 724 to blocks 730-738, which illustrate the controller mitigating the detected under-programming in order to proactively avoid future read errors caused by under-programming. Block 730 depicts the controller relocating data previously written to other physical pages 206 in the affected layer of the memory array 202 to pages in other layer(s) of memory array 202 in accordance with the vendor-specified program order. In addition, as further illustrated at block 730, the controller writes dummy data to all remaining unprogrammed physical pages 206, if any, in the affected layer of memory array 202 and invalidates all physical pages 206 in the affected layer. At block 732, the controller writes the data written by the most recent programming pass into an alternative layer of memory array 202 in accordance with the vendor-specific program order. In addition, the controller updates (e.g., increments) a per-block under-program counter, which indicates, for example, a number of under-programming error events detected in the block during the current P/E cycle or during a current monitoring interval (block 734).

At block 736, the controller determines whether or not the value of the under-program counter satisfies (e.g., is greater than or equal to) an under-programming count threshold. If so, the controller marks the affected layer or the entire block 204 for retirement, thus causing the layer or block to be withdrawn from use (block 738). Following block 738 or in response to a negative determination at block 736, the process returns to block 704, which has been described.

As has been described, in at least one embodiment, a non-volatile memory includes a plurality of cells each individually capable of storing multiple bits of data including bits of multiple physical pages. A controller of the non-volatile memory issues a command to perform a programming pass for a physical page among the multiple physical pages. The controller determines whether or not the programming pass took less than a minimum threshold time and no program fail status indication was received. Based on determining the programming pass took less than a minimum threshold time and no program fail status indication was received, the controller detects an under-programming error and performs mitigation for the detected under-programming error.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the present invention has been particularly shown as described with reference to one or more preferred embodiments, it will be understood by those skilled in the art that various changes in form and detail may be made therein without departing from the spirit and scope of the invention. For example, although aspects have been described with respect to a data storage system including a flash controller that directs certain functions, it should be understood that present invention may alternatively be implemented as a program product including a storage device storing program code that can be processed by a processor to perform such functions or cause such functions to be performed. As employed herein, a "storage device" is specifically defined to include only statutory articles of manufacture and to exclude signal media per se, transitory propagating signals per se, and energy per se.

In addition, although embodiments have been described that include use of a NAND flash memory, it should be appreciated that embodiments of the present invention can also be used with any other type of non-volatile random access memory (NVRAM).

The figures described above and the written description of specific structures and functions are not presented to limit the scope of what Applicants have invented or the scope of the appended claims. Rather, the figures and written description are provided to teach any person skilled in the art to make and use the inventions for which patent protection is sought. Those skilled in the art will appreciate that not all features of a commercial embodiment of the inventions are described or shown for the sake of clarity and understanding. Persons of skill in this art will also appreciate that the development of an actual commercial embodiment incorporating aspects of the present inventions will require numerous implementation-specific decisions to achieve the developer's ultimate goal for the commercial embodiment. Such implementation-specific decisions may include, and likely are not limited to, compliance with system-related, business-related, government-related and other constraints, which may vary by specific implementation, location and from time to time. While a developer's efforts might be complex and time-consuming in an absolute sense, such efforts would be, nevertheless, a routine undertaking for those of skill in this art having benefit of this disclosure. It must be understood that the inventions disclosed and taught herein are susceptible to numerous and various modifications and alternative forms. Lastly, the use of a singular term, such as, but not limited to, "a" is not intended as limiting of the number of items.

What is claimed is:

1. A method of controlling a non-volatile memory including a plurality of cells each individually capable of storing multiple bits of data including bits of multiple physical pages, the method comprising:
a controller of the non-volatile memory issuing a command to perform a programming pass for a physical page among the multiple physical pages;
the controller determining whether or not the programming pass took less than a minimum threshold time and no program fail status indication was received; and
based on determining the programming pass took less than a minimum threshold time and no program fail status indication was received, the controller detecting an under-programming error and performing mitigation for the detected under-programming error.

2. The method of claim 1, wherein:
the non-volatile memory includes an integrated circuit including a plurality of physical layers;
the method further comprises the controller determining the minimum threshold time based on which of the plurality of physical layers includes the physical page.

3. The method of claim 1, wherein:
the controller programs the physical pages in a plurality of programming passes including the programming pass; and
the method further comprises the controller determining the minimum threshold time based on which of the plurality of programming passes the programming pass is.

4. The method of claim 1, wherein:
the multiple physical pages are of a plurality of different page types;

the method further comprises the controller determining the minimum threshold time based on a page type of the physical page.

5. The method of claim 1, wherein the method further comprises:
the controller determining the minimum threshold time based on a program/erase (P/E) cycle count of a block containing the physical page.

6. The method of claim 1, wherein:
the non-volatile memory includes an integrated circuit including a plurality of physical layers;
performing mitigation includes the controller programming data intended for the physical page into a different one of the plurality of physical layers.

7. The method of claim 6, wherein:
the plurality of physical layers includes a particular layer; and
performing mitigation further includes relocating valid data from the particular layer, writing dummy data to non-programmed physical pages in the particular layer, and invalidating valid physical pages in the particular layer.

8. A computer program product, the computer program product comprising a computer readable storage device having program instructions embodied therewith, the program instructions being executable by a controller of a non-volatile memory including a plurality of cells each individually capable of storing multiple bits of data including bits of multiple physical pages including at least a first page and a second page, wherein, when executed, the program instructions cause the controller to perform:
issuing a command to perform a programming pass for a physical page among the multiple physical pages;
determining whether or not the programming pass took less than a minimum threshold time and no program fail status indication was received; and
based on determining the programming pass took less than a minimum threshold time and no program fail status indication was received, detecting an under-programming error and performing mitigation for the detected under-programming error.

9. The computer program product of claim 8, wherein:
the non-volatile memory includes an integrated circuit including a plurality of physical layers;
the program instructions cause the controller to perform determining the minimum threshold time based on which of the plurality of physical layers includes the physical page.

10. The computer program product of claim 8, wherein:
the controller programs the physical pages in a plurality of programming passes including the programming pass; and
the program instructions cause the controller to perform determining the minimum threshold time based on which of the plurality of programming passes the programming pass is.

11. The computer program product of claim 8, wherein:
the multiple physical pages are of a plurality of different page types;
the program instructions cause the controller to perform determining the minimum threshold time based on a page type of the physical page.

12. The computer program product of claim 8, wherein the controller is further configured to perform:
determining the minimum threshold time based on a program/erase (P/E) cycle count of a block containing the physical page.

* * * * *